United States Patent [19]

Ward

[11] 4,193,656
[45] Mar. 18, 1980

[54] EXTRACTION DEVICE FOR EXTRACTING A DIP FROM A DIP HEADER

[75] Inventor: John A. Ward, Carlisle, Pa.

[73] Assignee: AMP Incorporated, Harrisburg, Pa.

[21] Appl. No.: 972,119

[22] Filed: Dec. 20, 1978

[51] Int. Cl.² ............................................. H01R 13/62
[52] U.S. Cl. .................................... 339/45 M; 29/764
[58] Field of Search ............... 339/45 R, 45 M, 45 T, 339/74 R, 110 P, 17 CF; 29/762, 764

[56] References Cited

U.S. PATENT DOCUMENTS 3,008,115  11/1961  Oakes ................................. 339/45 R

FOREIGN PATENT DOCUMENTS 1209568  10/1970  United Kingdom .

*Primary Examiner*—Neil Abrams
*Attorney, Agent, or Firm*—Frederick W. Raring

[57] ABSTRACT

Extracting device for extracting a DIP from a DIP header comprises a normally flat member which is positioned between the opposed surfaces of the DIP and the DIP header. The flat member has movable portions which are arcuately movable away from the surface of the DIP header. The movable portions have projecting sections which extend beyond the DIP header. The projecting sections have integral levers which can be manipulated to cause the movable sections to move arcuately along axes which extend parallel to the DIP header. As the movable portions swing upwardly and away from the header, they extract the DIP leads from the terminals in the header.

9 Claims, 7 Drawing Figures

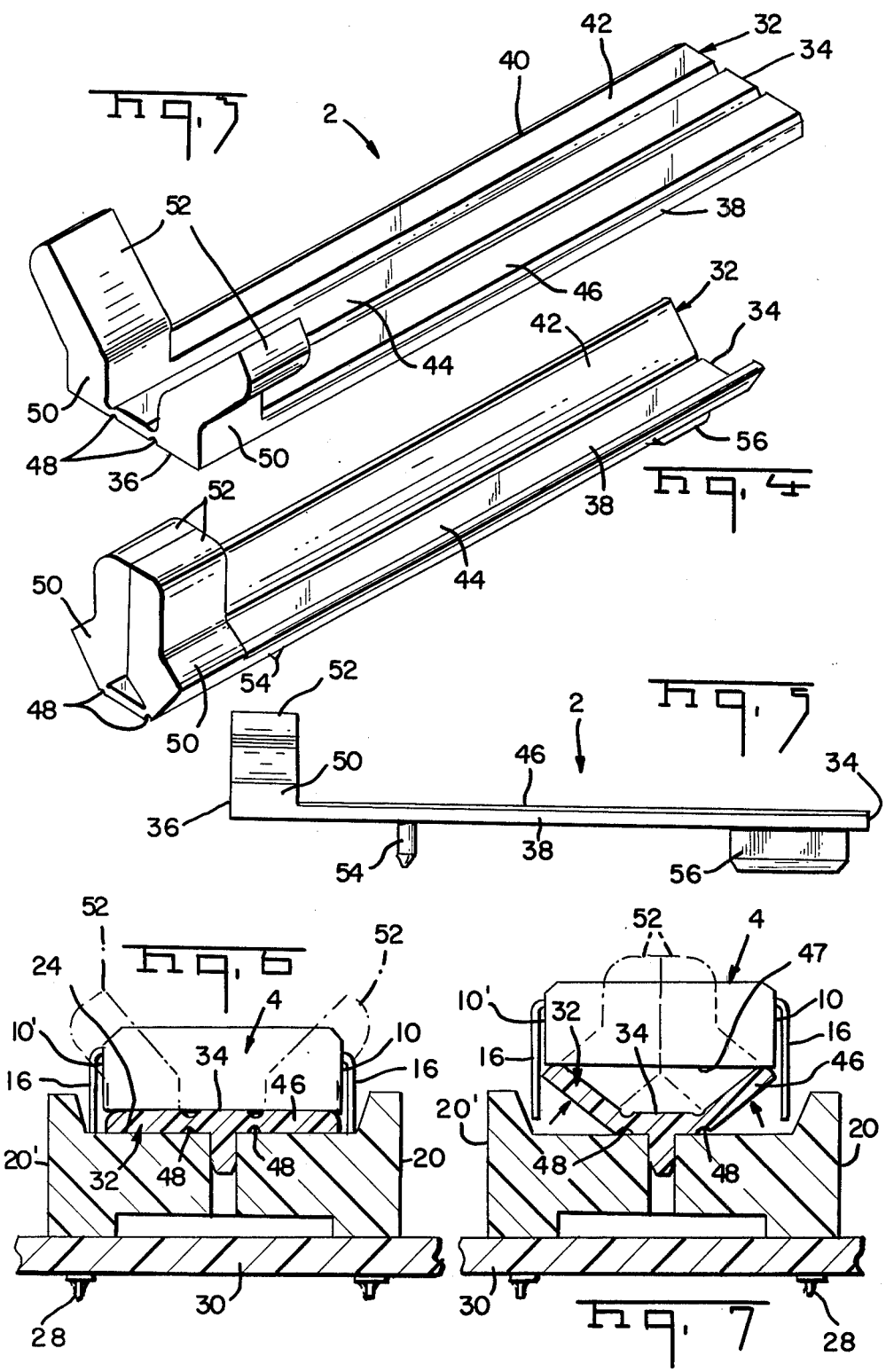

EXTRACTION DEVICE FOR EXTRACTING A DIP FROM A DIP HEADER

DESCRIPTION

Field of the Invention

This invention relates to devices which are placed between DIPs and DIP headers for the purpose of extracting the DIPs from the headers without damage to the leads extending from the DIP and into the header.

Background of the Invention

A common packaging means for solid state chips comprises a generally flat rectangular body of insulating material in which the chip is embedded. Conductors extend from the chip to parallel side edges of the rectangular body and leads extend from the side edges normally of the plane of the body. Packaging means of this type, which are commonly referred to as dual-in-line packages or DIPs, are mounted on a circuit board by inserting the leads into terminals contained in a connector housing of a type which is usually referred to as a DIP header. The terminals in the header are in turn connected to conductors on a circuit board, usually by soldering. Separate headers are commonly used in order to permit removal of the DIP for replacement or servicing purposes since it is only necessary to pull the DIP upwardly away from the header to disengage it from the terminals in the header.

DIPs are produced in varying sizes and having varying numbers of leads extending from their side edges. The smaller DIPs have two rows of leads, each row having for example, four leads extending therefrom while the larger sizes have twenty or more leads extending from each side. The leads are of relatively thin sheet metal, usually about 0.010 inches in thickness and, unless they are inserted and extracted from the header with reasonable care, they may become damaged during extraction and the DIP would thereby be rendered useless.

The leads will not be damaged when the DIP is extracted from the header if the DIP is grasped securely and moved away from the header in a direction extending normally of its own plane. If, however, the DIP is rocked during extraction, i.e., if it is removed by first pulling on one end of the DIP so that it becomes cocked relative to the header and then pulling on the other end, the leads may become bent during extraction. A technician in removing a DIP from a DIP header is sometimes tempted to rock the header during extraction because of the fact that the extraction forces required may be relatively high, for example, about thirty to forty pounds.

It is also a temptation to insert the blade of a screw driver between the DIP and the header and wedge the header upwardly when extracting it from the DIP. This technique can also result in damage to the DIP leads.

A variety of specialized extraction tools are available for extracting DIPs from DIP headers and these tools will prevent damage to the DIP leads. However, each size DIP requires a specialized tool for its particular size; furthermore, such tools are expensive and may not be available when they are needed. The present invention is directed to the achievement of an extremely inexpensive extraction device which is placed between the DIP and the header and which is effective to remove the DIP from the header when required without damage to the leads extending from the DIP.

A preferred embodiment of the invention comprises a rectangular member of plastic material having dimensions such that it can be placed between the DIP and the DIP header when the DIP leads are inserted into the terminals in the header. The extractor member has movable camming portions which are movable along arcuate paths away from the surface of the header so that upon such movement, these movable camming portions will push the DIP away from the header by the application of balanced forces on the header and the DIP.

The movable portions have projecting sections which extend laterally beyond the DIP and the header and these projecting sections have integral levers on their ends which can be pressed toward each other to cause the movable sections to move the DIP away from the header when removal is required.

DESCRIPTION OF THE DRAWINGS

FIG. 3 is a perspective view of the extraction device showing the device in its normal condition.

FIG. 4 is a view similar to FIG. 3 showing the positions of the parts when the device is actuated to extract a DIP from a header.

FIG. 5 is a side view of the extraction device.

FIG. 6 ia an end view of a DIP and DIP header showing the extraction device between the DIP end and the DIP header.

FIG. 7 is a view similar to FIG. 6 illustrating the manner in which the extractor removes the DIP from the header.

PRACTICE OF THE INVENTION

Figure 1:
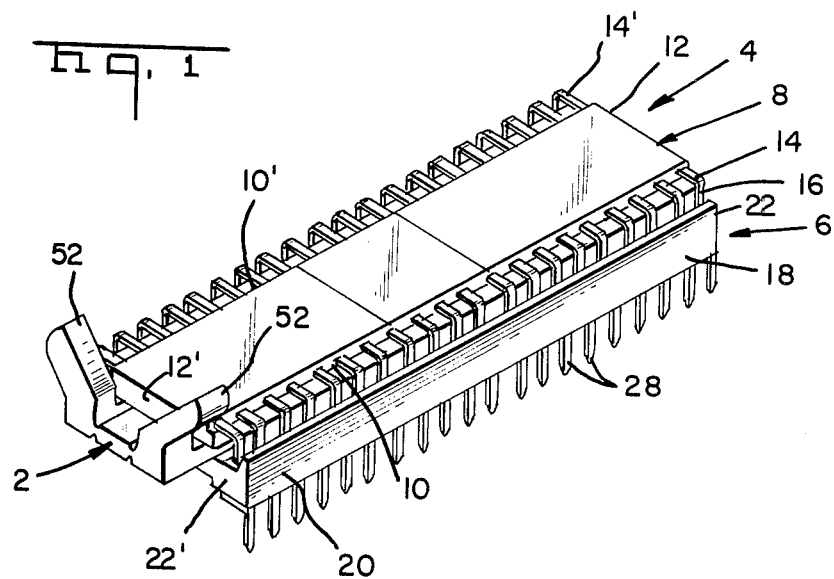
FIG. 1 is a perspective view of the DIP and a DIP header having an extraction device positioned between the opposed surfaces of the DIP and the header.

A DIP extraction device 2 in accordance with the invention is positioned between a DIP 4 and a DIP header 6 when the DIP is assembled to the header as shown in FIG. 1. The DIP 4 comprises a rectangular body 8 of insulating material having elongated sides 10, 10' which define the length of the body and ends 12, 12' which define the width of the body. A row of electrical leads 14, 14' extends from each of the sides 10, 10' and these leads are bent downwardly as shown at 16 so that they extend normally on the plane of the rectangular body 8.

Figure 2:
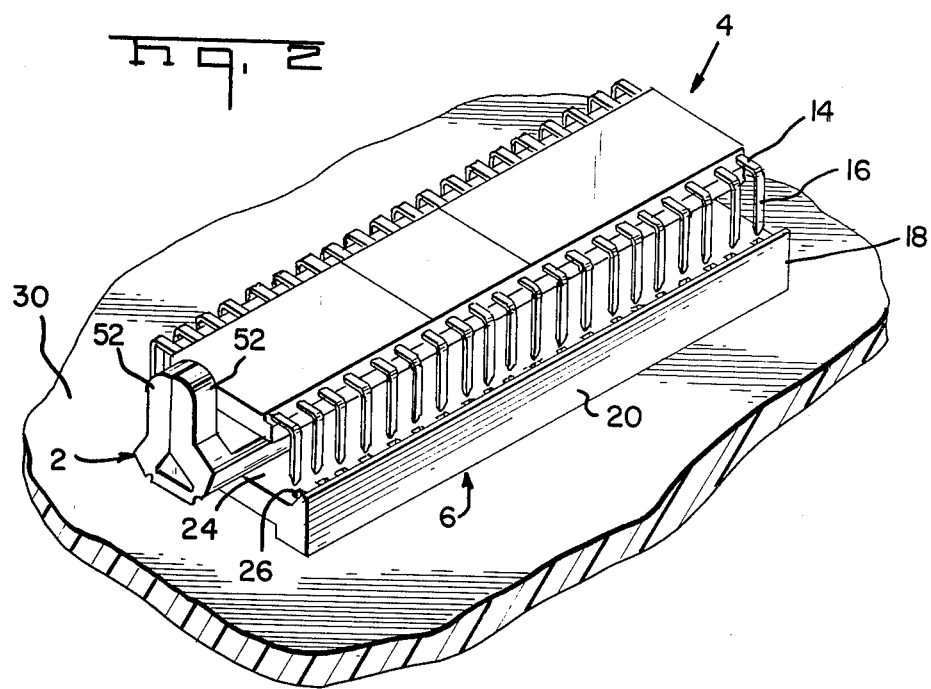
FIG. 2 is a view similar to FIG. 1, illustrating the action of the extraction device in removing the DIP from the header.

The DIP header 6 comprises a rectangular housing 18 of insulating material having sides 20, 20', ends 22, 22' and DIP receiving surface 24 (FIG. 2). Two rows of openings 26 are provided in the surface 24 which receive the ends 16 of the leads 14. The housing 18 contains terminals beneath each of these openings 26 from which terminal posts 28 extend downwardly from the lower surface of the housing. In normal use, these posts will extend through holes in a circuit board 30 and will be soldered to conductors on the underside of the circuit board.

Under ordinary circumstances, the DIP 4 is mated with the DIP header by aligning the leads 16 with the holes 26 and pushing downwardly on the rectangular body 8 of the DIP. This DIP insertion operation can, with reasonable care, be carried out by a technician without damage to the leads since it is only necessary to properly align the leads with the openings 26 and applying a pressing force to the upper surface of the body 8 of the DIP. However, extraction or removal of the DIP from the header is sometimes a difficult operation, particularly the DIPs having twelve or more leads 14 in each of the rows.

In accordance with the present invention, an extractor 2 (FIG. 4) is positioned on the surface 24 of the header prior to insertion of the leads 16 into the openings 26 of the header. The extracting device 2 comprises a relatively thin rectangular member 32 having ends 34, 36 and sides 38, 40. The width of this member, as measured between the side edges 38, 40 is substantially equal to the width of the rectangular body 8 of the DIP and less than the distance between the downwardly directed ends 16 of the leads in the two rows of the DIP. The length of the rectangular member 32, as measured between the ends 34, 36, is slightly greater than the length of the header 4 so that a portion of the member 32 will extend beyond the end 22 of the header and beyond the end 12' of the DIP.

The member 32 is comprised of first, second, and third sections 42, 44, and 46 respectively, the second section 44 being between the first and third sections as shown in FIG. 3. The second section 44 is connected to the first and third sections 42, 46 by integral hinges 48, FIGS. 6 and 7, which permit arcuate movement of the first and third sections relative to the second section. It will be understood that the extraction device is manufactured as a single-piece molding of a suitable thermoplastic material which is relatively firm in thick sections but which, in thin sections such as the hinges 48, can be flexed without tearing or other failure. The device might thus be injection molded of a suitable glass filled polyester composition.

The left hand portion of the member 32 which projects beyond the end 22' of the header is provided with integral levers 52 which extend obliquely outwardly from thickened sections 50 on the ends of the first and third sections 42, 46. As will be apparent from FIGS. 3 and 4, these levers 52 can be pinched between the thumb and forefinger to cause the sections 42, 46 to swing upwardly relative to the second section 44 of the rectangular member. If desired, a projecting section and levers can be provided at each end of the member 32.

If desired, mounting means can be provided to secure the extractor 2 to the surface 24 of the header housing. The embodiment disclosed has an integral mounting pin 54 and a mounting ear 56, extending from its lower surface. The ear and the pin are received in suitable openings in the housing 18 as shown in FIG. 7. The ear and pin can be bonded to the header if desired, by thermal or other bonding techniques.

In use, a separate extracting device will be positioned on the DIP receiving surface 24 of each of the headers on a circuit board prior to insertion of the leads 16 of the DIP into the openings in the headers. If it should be required that an individual DIP be extracted from its associated header, the technician need only pinch the obliquely extending levers 52 until the opposed surfaces are against each other as shown in FIG. 2. The pinching of these levers causes the first and third sections 42, 46 of the rectangular member 32 to swing arcuately upwardly about pivotal axes defined by the hinges 48 and during such upward movement, the edges of the first and third sections 42, 46 move across the downwardly facing surface 47 of the rectangular body 8 and lift it away from the surface 24 of the header. The forces applied to the underside of the DIP are symmetrical with respect to the longitudinal axis of the DIP body 8 and these forces are parallel to the rows of leads 16. The DIP is therefore moved upwardly in a direction extending normally of its own plane and the leads will emerge undamaged from the terminals in the header. A mechanical advantage is achieved by the levers and the sections 42, 46 of the member 32 and only a fairly light pressure on the levers is, therefore, required to extract the DIP. The outside edges of the sections 42, 46 may be rounded as shown to facilitate their movement over the underside of the DIP.

Because of the ease with which a DIP can be removed from a header, there is absolutely no temptation on the part of the technician to use any method of extracting a DIP from a header other than the extraction device. The device is extremely simple and can be produced at extremely low cost so the minor added expense of providing an individual extractor for each DIP on a circuit board is not significant.

I claim:

1. A molded one-piece plastic extraction device for extracting a dual-in-line package (DIP) from a DIP header, said DIP comprising a flat rectangular body having a predetermined length and a predetermined width, a row of spaced-apart leads extending from each of the parallel side edges of said body which define the length thereof, said leads extending normally of said body, said DIP header comprising a rectangular housing which comforms to the dimensions of said DIP, said housing having a DIP receiving surface and having spaced-apart rows of lead-receiving openings in said DIP receiving surface whereby said DIP is mated with said DIP header by aligning said leads with said openings and moving said rectangular body towards said DIP receiving surface with accompanying movement of said leads into said openings, said extraction device comprising:

a rectangular member having a width which is substantially equal to the width of said rectangular body and less than the distance between said rows of leads, and having a length which is greater than the length of said header whereby projecting portions of said member will extend beyond one end of said header when said rectangular member is positioned on said DIP receiving surface, said rectangular member comprising a plurality of rigid rectangular sections which are connected to each other by integral hinge means extending along the length of said member, said sections being normally coplanar and being movable arcuately from coplanar relationship with accompanying flexure of said hinge means, and integral levers extending from said projecting portions of two of said rectangular sections whereby, upon positioning said extraction device on said DIP receiving surface and inserting said leads of said DIP into said openings so that said extraction device is between said DIP and said DIP receiving surface, said DIP can be extracted from said header by moving said levers towards each other thereby to cause said sections to move arcuately away from said DIP receiving surface and move said DIP away from said header.

2. A DIP extracting device as set forth in claim 1, said integral hinge means comprising two spaced-apart hinges whereby said rectangular member comprises first, second, and third rectangular sections with said second section being between said first and third sections, said levers extending from said first and third sections.

3. A DIP extraction device as set forth in claim 2, said levers normally extending obliquely away from each other whereby, upon arcuate movement of said levers towards each other, said first and third sections move arcuately with said hinges serving as pivotal axes.

4. A DIP extraction device as set forth in claim 3, said second section having means thereon for securing said extraction device to said header.

5. In combination with a DIP and a DIP header, a molded one-piece plastic extraction device for removing said DIP from said DIP header, said DIP comprising a rectangular body having a row of leads extending from each of two opposite side edges thereof normally of the plane of said body, said DIP header comprising an insulating housing having a DIP receiving surface having two rows of lead-receiving openings therein, said leads extending into said openings, said extraction device comprising a normally flat rectangular member disposed between said DIP and said DIP receiving surface, said rectangular member having a width which is substantially equal to the width of said DIP and less than the distance between the rows of leads extending from said DIP, said member having movable portions which are arcuately movable away from said surface, said movable portions being symmetrically located with respect to said rows of leads whereby upon arcuate movement of said movable portions away from said DIP receiving surface, said DIP is moved normally of its own plane away from said DIP receiving surface, said movable portions having projecting portions which extend beyond one end of said DIP and said DIP header, integral actuator lever means on said projecting portions, said actuator lever means being effective upon movement thereof to move said movable portions arcuately away from said DIP receiving surface whereby, upon manipulation of said levers, said movable portions of said member move away from said DIP receiving surface and said DIP is pushed away from said header.

6. The combination set forth in claim 5, said rectangular member having integral hinge means extending between the ends thereof whereby said rectangular member comprises at least two rectangular sections, said sections comprising said movable portions.

7. The combination set forth in claim 6, said hinge means comprising two parallel spaced-apart hinges, said rectangular member comprising first, second, and third rectangular sections separated by said hinge means, said second section being between said first and third sections, said first and third sections constituting said movable portions.

8. The combination set forth in claim 7, said projecting portions extending from said first and third sections.

9. The combination of a DIP, a DIP header, and an in situ extraction device for moving said DIP from said DIP header, said extraction device comprising a flat rectangular body having a predetermined length and a predetermined width, a row of spaced-apart leads extending from each of the parallel side edges of said body which define the length thereof, said leads extending normally of said body, said DIP header comprising a rectangular housing which conforms to the dimensions of said DIP, said housing having a DIP receiving surface and having spaced-apart rows of lead-receiving openings in said DIP receiving surface, said rectangular body being parallel and proximate to said DIP receiving surface with said leads extending into said openings:

said in situ extraction device comprising a rectangular member having a width which is substantially equal to the width of said rectangular body and less than the distance between said rows of leads, and having a length which is greater than the length of said header, said rectangular member being between said DIP and said DIP receiving surface and having projecting portions which project beyond one end of said header and said rectangular body, said rectangular member comprising first, second, and third rectangular sections which are separated from each other by integral hinges which extend between the ends of said member and parallel to the length of said rectangular body, said first and third sections extending beside said rows of leads, said second section extending medially across said DIP receiving surface, an actuating lever extending from said first and third sections at said projecting portions, said levers extending obliquely away from said first and third sections and transversely of said DIP whereby, upon movement of said levers arcuately towards each other, said first and third sections are moved arcuately with respect to said hinges and push said DIP away from said DIP header.

* * * * *